United States Patent [19]
McClellan

[11] 3,796,866
[45] Mar. 12, 1974

[54] AUTOMATIC GAIN CONTROL CIRCUIT

[75] Inventor: William Reed McClellan, North Chelmsford, Mass.

[73] Assignee: RCA Corporation, New York, N.Y.

[22] Filed: June 1, 1972

[21] Appl. No.: 258,632

[52] U.S. Cl. ........... 235/92 PK, 235/92 R, 328/175, 340/347 CC, 235/92 CA, 235/92 CT, 250/205
[51] Int. Cl. ........................ H03k 13/02, H03f 11/02
[58] Field of Search ....... 235/92 PK, 92 EV, 92 CT, 235/92 CA, 92 CV; 340/347 CC; 250/205; 328/175, 173

[56] References Cited

UNITED STATES PATENTS

| | | | |
|---|---|---|---|
| 3,636,462 | 1/1972 | Baidauf | 328/175 X |
| 3,172,045 | 3/1965 | Thaler | 328/175 X |
| 3,105,230 | 9/1963 | MacIntyre | 340/347 CC |
| 3,533,098 | 10/1970 | Munoz | 340/347 CC |
| 3,544,895 | 1/1970 | Richman | 340/347 CC |
| 3,475,748 | 10/1969 | Price et al. | 340/347 CC |

*Primary Examiner*—Gareth D. Shaw
*Assistant Examiner*—Joseph M. Thesz, Jr.

[57] ABSTRACT

The count stored in a counter is translated to a gain control voltage for a light sensing device such as a photomultiplier. An electrical signal is produced by the sensing device each time it receives a light signal from a reference source. If the level of the electrical signal differs from a given value by more than a given amount, the count in the counter is changed, to change the gain control voltage in a sense to return the electrical signal level to said given value.

14 Claims, 2 Drawing Figures

AUTOMATIC GAIN CONTROL CIRCUIT

BACKGROUND OF THE INVENTION

Electrical apparatus for measuring physical events or quantities usually includes a transducer for converting the measured events or quantities into an electrical signal. Generally, the amplitude or magnitude of the electrical signal is directly related to the physical event or quantity being measured. Unfortunately, the signal is also affected by changes in the gain of the transducer due, for example, to deterioration with time or to temperature. Further, when the transducer is a light responsive unit and a light source is employed in conjunction therewith to measure the transmissivity or reflectivity of an unknown specimen, problems may develop with the light source. It may change in intensity due to natural deterioration, to changes in the supply voltage and to changes in temperature.

In the prior art it is known to periodically adjust the gain of the system (light source and transducer) by utilizing a known sample through which or from which light from the light source is transmitted to the transducer. An analog automatic gain control circuit is then employed to adjust the gain of the signal from the transducer to a desired value. Typically, a capacitor in the automatic gain control circuit is utilized as a memory to maintain the proper gain between calibration periods. Where the time lapse between recalibrations is long (e.g., many minutes), conventional analog circuits are not suitable.

SUMMARY OF THE INVENTION

The system includes circuit means adapted to receive and amplify reference signals produced by signal source means. Counter means initially stores a reference count corresponding to the amplified reference signal. This count is translated to a gain control signal and the latter is applied to the circuit means. When the amplitude of the amplified reference signal produced by the circuit means changes by more than a given amount, the count in the counter means is changed in a sense to restore the amplified reference signal to its previous level.

DETAILED DESCRIPTION

Figures 1, 2:
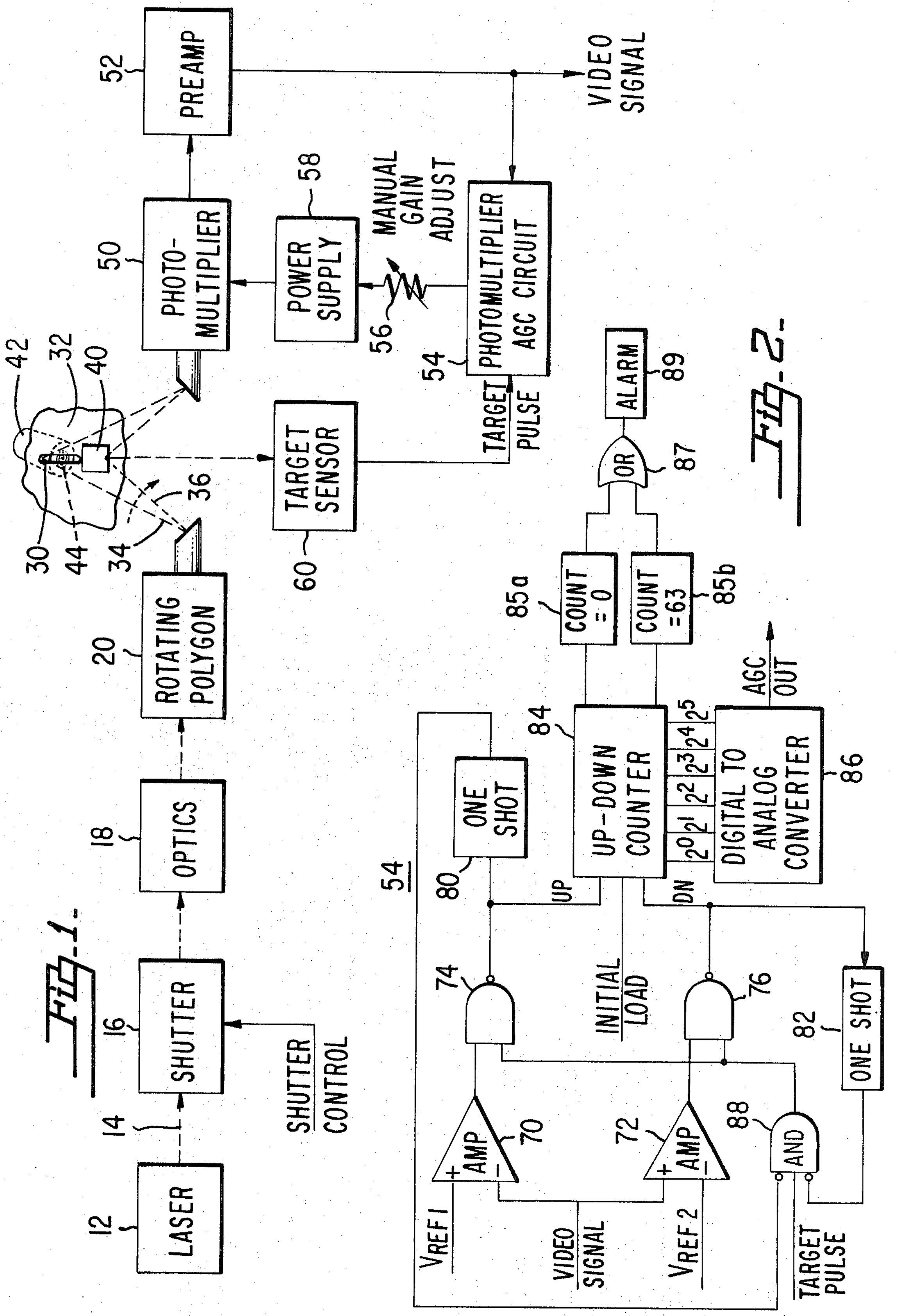
FIG. 1 is a block diagram of an optical scanning circuit employing the invention.
FIG. 2 is a digital automatic gain control circuit useful in practicing the invention.

Referring now to FIG. 1, which illustrates an article identification apparatus 10, a light source such as a laser 12 is adapted to emit a continuous beam of light as indicated by dashed line 14. A mechanical shutter 16 is positioned between light source 12 and an optical system 18. The beam 14 is directed to a scanning means such as a rotating polygon mirror assembly 20. The assembly reflects the beam through a slot 30 in a counter surface 32, only a small portion of which surface is shown being tilted for illustrative purposes. Optics 18 cause the beam 14 to be focused into a fine spot at counter surface 32. As indicated by dashed limit lines 34 and 36, the reflected beam scans the entire length of slot 30 and also scans across a reference target 40 attached to counter surface 32 just beyond one end of slot 30.

Articles such as cans 42 (shown largely in phantom) having a label 44 such as one with concentric rings (also shown in phantom) of two different reflectivities are passed over slot 30. Light is reflected from label 44 and also from reference target 40 to a light responsive transducer such as a photomultiplier 50. The output terminal of photomultiplier 50 is coupled to a preamplifier circuit 52, the output of which is labeled VIDEO SIGNAL. The VIDEO SIGNAL is converted by circuitry (not shown) into useful binary information. The VIDEO SIGNAL is also coupled to an automatic gain control (AGC) circuit 54.

The AGC circuit, in a manner to be described shortly, produces an AGC OUT signal which is applied to a manual gain adjusting potentiometer 56. Potentiometer 56 is coupled to a programmable power supply 58 which produces a voltage corresponding to the amplitude of signal received from AGC circuit 54 via potentiometer 56. The output of power supply 58 is coupled to photomultiplier 50. Photo-multiplier 50 is of the type which has a gain in decibels (db) which is a linear function of the voltage supplied to it.

A target sensor 60 positioned to receive reflected light from reference target 40 produces a TARGET PULSE signal only when shutter 16 is open and then only when light is reflected from reference target 40. The TARGET PULSE signal is coupled to AGC circuit 54 for purposes of controlling the operation of that circuit. A more detailed description of the various elements which produce the VIDEO SIGNAL will be found in patent application Serial No. 21,424, entitled "Merchandise Handling and Identifying System", filed Mar. 20, 1970, for W.E. Kinslow, Jr. and W.A. Mulle, and assigned to the assignee of the present application.

A brief description of the operation of FIG. 1 follows. Laser 12 emits a constant beam of light 14. Normally, a shutter 16 blocks the path of light from laser 12 to optics 18. However, when an article 42 is positioned over slot 30, the shutter, under control of a SHUTTER CONTROL signal (from a source not shown) is opened to permit light to enter optics 18. The SHUTTER CONTROL signal may be either from a manual source or may be coupled to a means for identifying the presence of an article 42 over slot 30, such as described in the aforementioned patent application.

The light beam from optics 18 is directed onto rotating mirror assembly 20 which causes the beam to scan along slot 30 and over reference target 40 at a periodic rate which is on the order of a few hundred microseconds. Light from label 44 and from reference target 40 is directed to photomultiplier 50 where it is converted into electrical signals amplified by amplifier 52. Each time the beam 14 is reflected from reference target 40, target sensor 60 emits a TARGET PULSE signal which primes AGC circuit 54 to compare the amplitude of the VIDEO SIGNAL against a desired standard amplitude. Should the VIDEO SIGNAL either be above or below desired limits, the AGC signal from AGC circuit 54 is appropriately adjusted upward or downward which adjusts the voltage from power supply 58 and therefore the gain of photomultiplier 50 until the gain of photomultiplier 50 is adjusted to satisfactory limits.

Any one of a number of conditions can cause an unwanted change in the level of the signal produced by photomultiplier 50. For example, the photomultiplier transducer may itself deteriorate with age or change with temperature. The output from laser 12 may change due to temperature or to aging of the laser and also may change in response to voltage fluctuations of the laser power source, as other examples. The optics 18 or the mirrors of rotating polygon assembly 20 may become dirty and therefore not reflect as much light as previously, as still other examples. If the shutter 16 were not present so that light were to continuously scan across slot 30 and target 40, a simple analog AGC circuit 54 could be employed. However, because of the presence of shutter 16, reference information may not reach AGC circuit 54 for an indefinite time period such as several minutes at a time, yet circuit 54 must maintain a constant gain during these intervals to be in a state of readiness to read the next label 44 on article 42.

It should be noted that adjustment of the gain of preamplifier 52 rather than of photomultiplier 50 may be effected by coupling the AGC circuit (via appropriate circuitry) to preamplifier 52. It has been found as a practical matter, however, that photomultiplier 50 has more dynamic range than the preamplifier and is therefore the better element to have its gain varied.

In FIG. 2, which illustrates an incremental automatic gain control circuit, the VIDEO SIGNAL from preamplifier 52 (FIG. 1) is applied to the positive and negative terminals, respectively, of two comparator amplifiers 72 and 70. A relatively low amplitude voltage $V_{ref\,1}$ is applied to the positive terminal of amplifier 70 while a relatively larger amplitude voltage $V_{ref\,2}$ is applied to the negative terminal of amplifier 72. These voltages, which are produced by any convenient voltage source (not shown), are adjusted to be relatively close in amplitude, being separated by approximately 10 percent of their value. Amplifiers 70 and 72 are of the type which, in response to a voltage level at their positive terminal being more positive than the voltage level at their negative terminal produce a logic "1". When the reverse conditions are true, they produce a logic "0". The output terminal of amplifier 70 is coupled to one input terminal of a gate 74 while the output terminal of amplifier 72 is coupled to a similar gate 76. Gates 74 and 76 are of the type which produce a logic "0" at their output terminals when all input terminals are at a logic "1" level and produce a logic "1" output under all other conditions at their input terminals.

The output terminal of gate 74 is coupled to a one shot 80 to the intput terminal labeled UP of an up-down counter 84. Similarly, the output terminal of gate 76 is coupled to a one shot 82 and to the other input terminal labeled DN of up-down counter 84. One shots 80 and 82 are responsive to the receipt of a change in input signal from a logic "1" to a logic "0" for producing a logic "1" output pulse having a duration of several milliseconds. The count stored in up-down counter 84 is incremented by 1 in response to a change in signal at its UP input terminal from a logic "0" to a logic "1". A similar signal at its DN input decrements the counter by one. A six-stage counter 84 is shown, but the number of stages chosen depends on the magnitude of change and the dynamic range desired from power supply 58 for each change of 1 in the counter. That is, if the power supply is to be stepped in very small increments with a large dynamic range, a large number of stages is required in counter 84 while if the power supply can be stepped in rather large increments, then only a relatively small number of stages is required in counter 84.

Counter 84 is connected to two decoders **85*a* and 85*b*. Decoder 85*a* produces a logic "1" whenever the counter is at a count of 0 while decoder 85*b* produces a logic "1" whenever the counter is at a full count (63 in the counter illustrated). These decoders are coupled through an OR gate 87 to an alarm 89. Alarm 89 may be audible, visual or electronic. The presence of an alarm signal indicates that the AGC circuit 54** has reached its limits of adjustability and further indicates a high probability of failure of one or more of the scanning system components.

The various stages of up-down counter 84 are coupled to a digital-to-analog converter 86 which converts the count into an analog signal labeled AGC OUT. The AGC OUT signal is adjustably coupled to controllable power supply 58 (FIG. 1). One shots 80 and 82 are coupled to two inhibit terminals of an AND gate 88. The TARGET PULSE signal from target sensor 60 (FIG. 1) is coupled to a third normal input terminal of AND gate 88 while the output terminal of the AND gate is coupled to input terminals of each of gates 74 and 76.

The operation of FIG. 2 is as follows. A count initially is placed in the counter 84 such as a count equal to one half the maximum count possible. This initial loading may be accomplished manually and is indicated schematically in the figure by the lead legended "INITIAL LOAD". During this initial load interval, the count is prevented from changing by any method appropriate to the type of counter being used such as by forcing flip-flops in a flip-flop counter to appropriate states. Then, potentiometer 56 is adjusted to a setting at which the VIDEO SIGNAL level produced by the preamplifier 52, while light is reflected from reference target 40, is midway between $V_{ref\,1}$ and $V_{ref\,2}$. During these adjustments, gates 74 and 76 have no effect on counter 84.

After these adjustments have been made, the entire circuit may be placed in its normal operating condition and the polygon 20 continuously rotated. The initial count remains in the counter but now can be changed. The VIDEO SIGNAL output from preamplifier 52 (FIG. 1) is constantly monitored by amplifiers 70 and 72. If the signal goes below the preset $V_{ref\,1}$, amplifier 70 produces a logic "1" while if the VIDEO SIGNAL goes above $V_{ref\,2}$, amplifier 72 produces a logic "1". A logic "1" signal from either of amplifiers 70 or 72 primes gate 74 or gate 76, respectively. Then, whenever beam 14 scans across the reference target 40 (FIG. 1), the resultant TARGET PULSE signal will enable AND gate 88 (since the outputs of one shots 80 and 82 are normally at a "0" level. When AND gate 88 receives a logic "1" at its normal input terminal and logic "0's" at its inhibit input terminals, it will produce a logic "1" output. Then, if either gate 74 or gate 76 is primed by its respective amplifier, that logic gate will be enabled producing a logic "0".

Thus, for example, if the VIDEO SIGNAL drops below $V_{ref\,1}$, gate 74 will become enabled when the TARGET PULSE signal is present. The resultant logic "0" output triggers one shot 80 and the logic "1" output pulse produced by one shot 80 blocks AND gate 88 and thereby blocks logic gate 74. The result is that gate 74 produces a relatively short negative-going pulse.

The lagging edge of this pulse representing a change from a logic "0" to a logic "1" is applied to the UP terminal of up-down counter 84 and causes the stored count to be incremented by one. As a result, the analog AGC OUT signal produced by converter 86 is increased in amplitude. This causes the output voltage of power supply 58 (FIG. 1) to increase which increases the gain of photomultiplier 50 and therefore increases the level of the VIDEO SIGNAL.

Power supply 58 requires time (milliseconds) to stabilize after each change in the AGC control signal level. This time is provided by the one shots 80 and 82. Each time a one shot is triggered, its relatively long (several milliseconds) positive-going pulse disables AND gate 88. This prevents any further changes in the count at 80 (and any changes in the AGC OUT signal) for the duration of the positive pulse.

If the VIDEO SIGNAL goes above $V_{ref\ 2}$, an action similar to that previously described occurs except that gate 76 is enabled to decrement counter 84 and one shot 82 is enabled to disable AND gate 88. Should the counter count to either of its limits (0 or 63) alarm 89 is enabled via OR gate 87. In some applications it may be desirable to trigger the alarm before the counter limits are reached such as, for example, at a count of 3 and at a count of 60. Decoders for these two values could be substituted for the decoders 85a and 85b illustrated.

Although the outputs of both gates 74 and 76 could be ORed together to drive a single one shot 80 or 82, it has been found that the power supply stabilizers in a different amount of time after an increment than after a decrement. Since it is desired to move the gain of photomultiplier 50 within the desired range as quickly as possible, two one shots, as shown, have been found most desirable. In one practical embodiment, one shot 80 is selected to have a duration of 20 milliseconds while one shot 82 is selected to have a duration of 2,000 milliseconds.

A modification of the circuit of FIG. 2 may be effected by utilizing only a single comparator amplifier, for example 70. The output terminal is coupled to gate 74 as in FIG. 2 and is also coupled to an inverter. The output terminal of the inverter is coupled to an input terminal gate 76 in place of amplifier 72. Then, $V_{ref\ 1}$ is set equal to the level of VIDEO SIGNAL desired when photomultiplier 50 (FIG. 1) is receiving light from reference target 40. All other elements are as in FIG. 2. When the VIDEO SIGNAL goes below $V_{ref\ 1}$, the logic "1" from amplifier 70 primes gate 74. When the reverse conditions are true, the logic "1" from the inverter primes gate 76. Operation otherwise is as described for FIG. 2.

Although an automatic gain control circuit has been described in the context of an article scanning apparatus, such a device has widespread use. In other applications, modifications could be made to the circuit without departing from the invention described. Thus, for example, if the means for adjusting the gain of the transducer could be altered rapidly, one shots 80 and 82 would not be necessary. In fact, if the gain control means could take several pulses while the scan beam 14 is over reference target 40, a multivibrator could be substituted for the one shots to produce rapid up or down count from counter 84. Further, if it were desired only to control the gain of the photomultiplier, it might be possible to periodically project a known reference signal directly from a light source into the photomultiplier. Also, as an alternative to reflected light as has been described, the photomultiplier might be adapted to receive light transmitted through some object to be measured and also transmitted through the reference target rather than reflected from it. Further, while a light sensitive system has been described, the digital AGC circuit is useful for other forms of transmittable energy such as magnetic energy. It is also useful to control the gain of any electrical signal regardless of the source of the signal.

What is claimed is:

1. In Combination:

signal source means producing reference signals:

circuit means responsive to a gain control signal for amplifying the signals produced by said signal source;

counter means adapted to continuously store a count representative solely of said gain control signal;

means for initially placing in said counter means a reference count corresponding to a signal of given amplitude produced by said circuit means in response to the reference signal produced by said source;

means for translating the count stored in said counter means to said gain control signal and applying the same to said circuit means; and means responsive to a change of more than a given amount in the amplitude of the amplified reference signal produced by said circuit means for changing the count in said counter means in a sense to restore the amplified reference signal to its previous level.

2. In combination:

signal source means producing reference signals;

circuit means responsive to a gain control parameter of a control signal for amplifying the signals produced by said signal source;

counter means adapted to count in one direction at a given rate and to count in another direction at a different rate;

means for initially placing in said counter means a reference count corresponding to a signal of given amplitude between two preselected limits produced by said circuit means in response to the reference signal produced by said source;

means responsive to said amplified signals for producing a first signal to change the count in said counter means in said one direction whenever said amplified signals exceed the larger one of said preselected limits;

means also responsive to said amplified signals for producing a second signal to change the count in said counter means in said another direction when said amplified signals are lower than the other of said preselected limits; and means for translating the count stored in said counter means to said control signal and for applying the same to said circuit means in a sense to restore the amplified reference signal to its previous level.

3. The combination as set forth in claim 2 wherein said parameter has upper and lower limits and further including means responsive to the count in said counter going outside of preselected limits corresponding to the upper and lower limits of said parameter for producing an alarm signal.

4. In combination:

a reference target;

means producing a light beam the intensity of which may vary with time;

means for scanning said light along a path which intercepts said reference target;

light responsive means positioned to receive light from the path illuminated by said scanning light for producing a signal the amplitude of which is a function of the light received by said light responsive means and also a function of an external gain control signal;

means producing a target signal indicative of a scan over said reference target;

counter means;

means responsive to the count in said counter for producing said external gain control signal for controlling the amplitude of said signal produced by said light responsive means to be within first and second preselected limits; and means responsive to the target signal and responsive to a signal from the light responsive means outside of the preselected limits and producing a signal for changing the count in said counter in a sense to restore the light responsive means signal to within said preselected limits.

5. The combination as set forth in claim 4 wherein said means responsive to the count in said counter comprises a digital-to-analog converter producing an analog signal proportional to the count in said counter and also comprises means responsive to changes in said analog signal for changing the amplitude of said signal from said light responsive means.

6. The combination as set forth in claim 4 further including means responsive to the signal for changing the count in said counter for controlling the rate at which said counter counts.

7. In Combination:

means producing, during discrete time intervals, an optical reference signal;

transducer means adapted to receive said reference signal and responsive to a gain control signal for producing an output signal corresponding to said reference signal;

counter means;

digital-to-analog converter means coupled to said counter means for producing an analog signal corresponding to the count in said counter means;

means responsive to said analog signal for producing said gain control signal and continuously applying the same to said transducer means;

first comparison means receptive of said transducer output signal, for producing a first signal when said transducer signal is greater in amplitude than a first reference level for changing the count in said counter means during said discrete time intervals in a sense to restore said transducer output signal to a level below said first preselected limit;

second comparison means receptive of said transducer output signal for producing a second signal when said transducer signal is lower in amplitude than a second reference level, lower than said first for changing the count in said counter means during said discrete time intervals in a sense to restore said transducer output signal to a level above said second preselected limit; and means for preventing the count in said counter means from changing between said discrete intervals.

8. In Combination:

signal source means producing, during discrete spaced time intervals, reference signals;

circuit means coupled to said signal source means and responsive to a gain control signal for producing a signal having a parameter the value of which is a function of the value of said gain control signal and of the reference signals produced by said signal source;

counter means means for translating the count stored in said counter means to said gain control signal and applying the same to said circuit means;

means responsive to a change in the value of said parameter to a value outside preselected limits for changing the count in said counter means in a sense to restore the value of said parameter to one within said preselected limits; and means for preventing the count stored in said counter means during each said discrete time interval from changing until the following discrete time interval.

9. In Combination:

signal source means producing reference signals, said signal source means comprising an energy producing means, the energy level of which may vary with time and an energy target means adapted to transmit a fixed fraction of the energy received by it to said circuit means during spaced time intervals;

circuit means responsive to a gain control signal for amplifying the signals produced by said signal source;

counter means;

means for initially placing in said counter means a reference count corresponding to a signal of given amplitude produced by said circuit means in response to the reference signal produced by said source;

means for translating the count stored in said counter means to a gain control signal and applying the same to said circuit means; and means responsive to a change of more than a given amount in the amplitude of the amplified reference signal produced by said circuit means for changing the count in said counter means in a sense to restore the amplified reference signal to its previous level.

10. In Combination:

means intermittently producing an optical reference signal;

transducer means adapted to receive said reference signal and responsive to a gain control signal for producing a signal corresponding to said reference signal:

counter means;

digital-to-analog converter means for producing an analog signal corresponding to the count in said counter means;

means responsive to said analog signal for producing said gain control signal;

a first comparison means for producing a first signal when said transducer signal goes above a first preselected limit for changing the count in said counter means in a sense to restore said transducer signal below said first preselected limit;

a second comparison means for producing a second signal when said transducer signal goes below a second preselected limit for changing the count in said counter means in a sense to restore said transducer signal above said second preselected limit; and means producing a presence signal indicating unambiguously the presence of said reference signal and wherein said first signal and said presence signal in combination change the count in said counter and wherein said second signal and said presence signal in combination change the count in said counter.

11. The combination of:

source means producing a reference signal;

receiver means receptive of said reference signal and responsive to a gain control signal for amplifying said reference signal in an amount dependent upon the value of said gain control signal;

counter means having an input circuit and an output circuit;

comparison means for comparing, during discrete, spaced time intervals, the amplified reference signal produced by said receiver means with first and second reference levels said first level higher than said second, for producing a first count correction signal when the amplified reference signal is greater in amplitude than the first level and for producing a second count correction signal when the amplified reference signal is smaller in amplitude than the second level;

means for coupling the count correction signal produced by said comparison means to said input circuit of said counter means during said discrete, spaced time intervals to thereby, during each such interval, change the count stored in said counter means in one sense if a first signal is present, in the opposite sense if a second signal is present, and to leave the count unchanged if neither signal is present;

means for retaining the count stored in the counter means during each said discrete time interval until the following discrete time interval, comprising means for effectively blocking said input circuit of said counter means during the periods between said spaced discrete time intervals; and means coupled to said output circuit of said counter means and to said receiver means for continuously translating the count stored in said counter means to a gain control signal and applying the latter to said receiver means in a sense to maintain said amplified reference signal within said first and second levels.

12. The combination as set forth in claim 11 wherein said source means includes means producing an optical signal and wherein said receiver means includes a photomultiplier, said gain control signal being applied to said photomultiplier.

13. The combination as set forth in claim 12 wherein said source means comprises an optical target, means for periodically scanning a beam of light over said target and means for blocking said beam of light during spaced time intervals which may recur aperiodically at a relatively low rate compared to the periodic scanning rate.

14. The combination as set forth in claim 11 wherein said means coupled to the output circuit of said counter means includes digital to analog converter means.

* * * * *